United States Patent
Sim et al.

(10) Patent No.: US 9,877,407 B1
(45) Date of Patent: Jan. 23, 2018

(54) APPARATUS AND SYSTEM FOR MODULAR CABLE MANAGEMENT IN TELECOMMUNICATIONS SYSTEMS

(71) Applicant: Juniper Networks, Inc., Sunnyvale, CA (US)

(72) Inventors: Henry K. Sim, Mountain View, CA (US); Ken R. Weber, San Jose, CA (US); Mahesh Nagarajan, San Jose, CA (US); Brian J. Ray, Livermore, CA (US); Adolpho Gonzalez, Fresno, CA (US); Alex Brown, San Jose, CA (US); Tark Abed, Palo Alto, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 147 days.

(21) Appl. No.: 14/871,142

(22) Filed: Sep. 30, 2015

(51) Int. Cl.
*G02B 6/00* (2006.01)
*H05K 7/18* (2006.01)
*G02B 6/44* (2006.01)
*H05K 7/14* (2006.01)

(52) U.S. Cl.
CPC .......... *H05K 7/186* (2013.01); *G02B 6/4471* (2013.01); *H05K 7/1415* (2013.01); *H05K 7/1417* (2013.01); *H05K 7/1461* (2013.01)

(58) Field of Classification Search
CPC ... G02B 6/4455; G02B 6/4452; G02B 6/4471
See application file for complete search history.

(56) References Cited

U.S. PATENT DOCUMENTS

| | | | | |
|---|---|---|---|---|
| 2009/0245746 | A1* | 10/2009 | Krampotich | G02B 6/4455 385/135 |
| 2015/0181743 | A1* | 6/2015 | Skirmont | H05K 7/1409 361/679.58 |

* cited by examiner

*Primary Examiner* — Sung Pak
*Assistant Examiner* — Hoang Tran
(74) *Attorney, Agent, or Firm* — FisherBroyles, LLP

(57) ABSTRACT

The disclosed apparatus may include at least one physical extension handle that connects to at least one ejector that facilitates securing a line card to a chassis of a telecommunications system and ejecting the line card from the chassis of the telecommunications system. The physical extension handle may, when connected to the ejector, extend the ejector such that a user is able to access the ejector by way of the physical extension handle to secure the line card to or eject the line card from the chassis of the telecommunications system using the physical extension handle. Additionally or alternatively, the physical extension handle may facilitate physically supporting one or more communication cables connected to the line card in a horizontal orientation such that the communication cables avoid hanging down vertically directly from the chassis. Various other apparatuses and systems are also disclosed.

16 Claims, 12 Drawing Sheets

APPARATUS AND SYSTEM FOR MODULAR CABLE MANAGEMENT IN TELECOMMUNICATIONS SYSTEMS

BACKGROUND

Telecommunications systems often facilitate communication among computing devices within a network and/or across networks. For example, a telecommunications system may include a set of line cards that are each positioned in a horizontal orientation and aligned vertically relative to one another. In this example, each line card may include multiple communication ports. Some or all of these communication ports may be connected to a fiber optic cable that runs from the telecommunications system to another computing device and/or telecommunications system.

Unfortunately, when hanging down from the telecommunications system, the collection of fiber optic cables may impede access to the ejection mechanisms on the line cards and/or even form a so-called "rat's nest". Additionally or alternatively, in the event that the telecommunications system's chassis is heavily populated with line cards and has front-back airflow, the collection of fiber optic cables may impair the front-back airflow and thus increase the operating temperature of the telecommunications system.

Although some traditional cable management solutions have been developed, these solutions may still have certain deficiencies and/or shortcomings. For example, a traditional cable management solution may attach to and/or run along the entire length of the telecommunications system's chassis. Additionally or alternatively, the traditional cable management solution may be difficult or even impossible to install while the chassis of the telecommunications system is secured to a rack.

The instant disclosure, therefore, identifies and addresses a need for improved and/or additional apparatuses and systems for modular cable management in telecommunications systems.

SUMMARY

As will be described in greater detail below, the instant disclosure generally relates to apparatuses and systems for modular cable management in telecommunications systems. In one example, an apparatus for accomplishing such a task may include at least one physical extension handle that connects to at least one ejector that facilitates securing a line card to a chassis of a telecommunications system and ejecting the line card from the chassis of the telecommunications system. The physical extension handle may, when connected to the ejector, extend the ejector such that a user is able to access the ejector by way of the physical extension handle to secure the line card to or eject the line card from the chassis of the telecommunications system using the physical extension handle. Additionally or alternatively, the physical extension handle may facilitate physically supporting one or more communication cables connected to the line card in a horizontal orientation such that the communication cables avoid hanging down vertically directly from the chassis.

Similarly, a line card incorporating the above-described apparatus may include at least one ejector that facilitates securing the line card to the chassis of a telecommunications system and ejecting the line card from the chassis of the telecommunications system. The line card may also include at least one physical extension handle that connects to the ejector to extend the ejector such that a user is able to access the ejector by way of the physical extension handle to secure the line card to or eject the line card from the chassis of the telecommunications system using the physical extension handle. Additionally or alternatively, this physical extension handle may facilitate physically supporting one or more communication cables connected to the line card in a horizontal orientation such that the communication cables avoid hanging down vertically directly from the chassis.

In another example, an apparatus for modular cable management may include a first physical cable guide that connects to a first side rail of a line card that secures to a chassis of a telecommunications system and extends from a first end of the line card and facilitates physically supporting one or more communication cables connected to the line card in a horizontal orientation. This apparatus may also include a second physical cable guide that connects to a second side rail of a line card that secures to a chassis of a telecommunications system and extends from a second end of the line card and facilitates physically supporting the communication cables connected to the line card in the horizontal orientation. This apparatus may further include a cable tray that connects to the first physical cable guide and the second physical cable guide and provides supplemental support for the communication cables to maintain the communication cables in the horizontal orientation.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
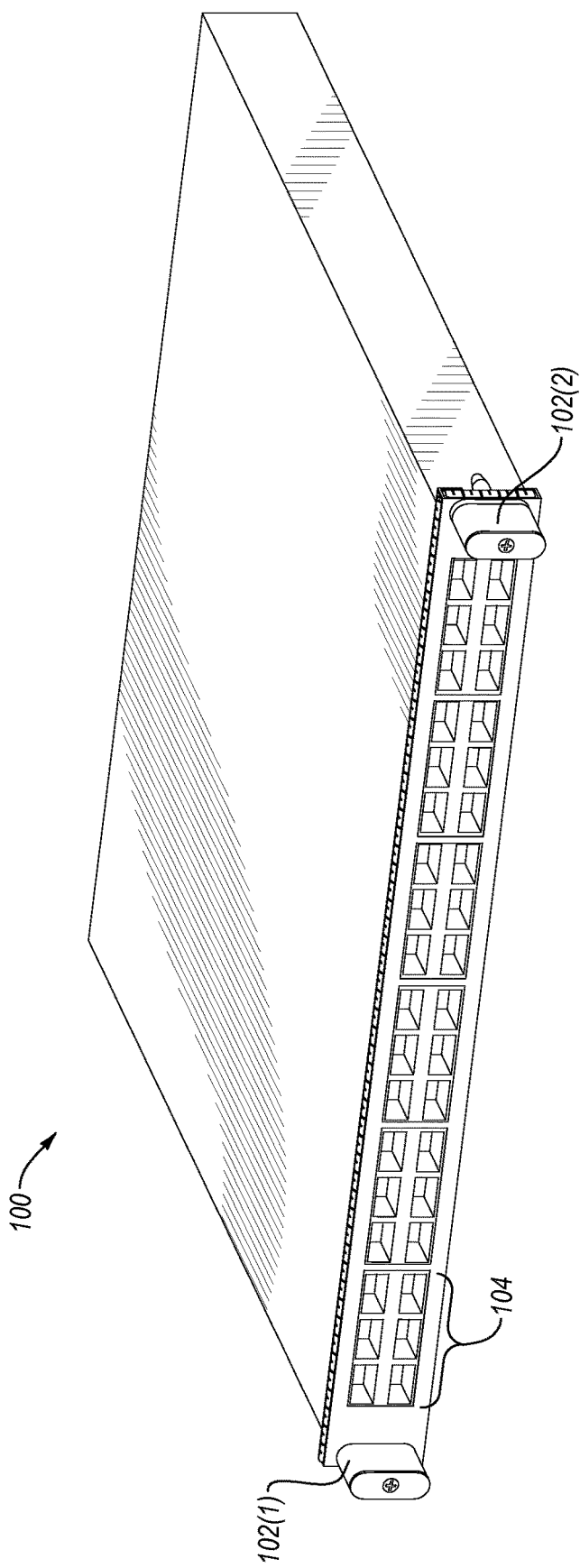
FIG. 1 is a block diagram of a line card capable of securing to a chassis of a telecommunications system.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes various apparatuses and systems for modular cable management in telecommunications systems. As will be explained in greater detail below, by connecting physical extension handles to the ejectors of a line card, embodiments of the instant disclosure may provide various advantages over traditional configurations. For example, these physical extension handles may each serve as a cable guide that supports communication cables connected to the line card in a horizontal orientation such that the communication cables remain more organized and avoid forming a so-called "rat's nest". By supporting the communication cables in this way, these physical extension handles may be able to improve the front-back airflow through the telecommunications system and thus decrease the telecommunications system's operating temperature even in the event that the telecommunications system is heavily populated with line cards.

In addition, each set of physical extension handles may represent a modular and/or removable cable management solution. For example, an administrator of a telecommunications system may modularly apply physical extension handles to any individual line card, all of the line cards, or any combination of line cards secured (or to be secured) to the telecommunications system. Moreover, the administrator may be able to successfully install the physical extension handles even while the chassis of the telecommunications system is secured to a rack.

The following will provide, with reference to FIGS. 1-12, examples of apparatuses, systems, and implementations for modular cable management in telecommunications systems. FIG. 1 shows a block diagram of an exemplary line card 100 capable of being secured to a telecommunications system. Line card 100 generally represents any type or form of electrical component and/or circuit board with one or more ports and/or interfaces that facilitate communication within a network and/or across a plurality of networks. Examples of line card 100 include, without limitation, Field-Replaceable Units (FRUs), Physical Interface Cards (PICs), Flexible PIC Concentrators (FPCs), Switch Interface Boards (SIBs), control boards, routing engines, communication ports, fan trays, connector interface panels, variations of one or more of the same, combinations of one or more of the same, or any other suitable electrical component that facilitates communication in connection with a telecommunications system.

As illustrated in FIG. 1, line card 100 may include and/or incorporate one or more ejectors 102(1)-(2) that facilitate securing line card 100 to and/or ejecting line card 100 from a chassis of a telecommunications system. Ejectors 102(1)-(2) generally represent any type or form of physical member that enables an administrator of a telecommunications system to secure a line card to and/or eject a line card from the telecommunications system. Examples of ejectors 102(1)-(2) include, without limitation, members, handles, levers, shafts, arms, screws, grips, knobs, buttons, switches, variations of one or more of the same, combinations of one or more of the same, or any other suitable ejectors.

As a specific example, ejectors 102(1)-(2) may each include and/or represent a helical and/or worm member or component capable of being screwed into a threaded hole in a chassis of a telecommunications system. In this example, an administrator of the telecommunications system may secure line card 100 to the chassis of the telecommunications system by rotating each of ejectors 102(1)-(2) in a clockwise direction into corresponding holes of the chassis. Additionally or alternatively, the administrator may eject line card 100 from the chassis of the telecommunications system by rotating each of ejectors 102(1)-(2) in a counterclockwise direction away from the corresponding holes of the chassis. Once line card 100 is freed and/or ejected from the chassis, the administrator may be able to remove, repair, and/or replace line card 100.

As illustrated in FIG. 1, line card 100 may include and/or incorporate one or more communication ports 104 that facilitate communication facilitate communication within a network and/or across a plurality of networks. Communications ports 104 generally represent any type or form of physical interfaces, devices, and/or housings that form at least a portion of a connection or link within a network and/or across a plurality of networks. Examples of communication ports 104 include, without limitation, Quad Small Form-factor Pluggable (QSFP) ports, Ethernet ports, fiber optic ports, Fibre Channel ports, optical ports, InfiniBand ports, CXP connectors, Multiple-Fiber Push-On/Pull-Off (MPO) connectors, XAUI ports, XFP transceivers, XFI interfaces, C Form-factor Pluggable (CFP) transceivers, variations of one or more of the same, combinations of one or more of the same, or any other suitable communication ports. Although FIG. 1 illustrates only a single set of labelled communication ports, line card 100 in FIG. 1 may include and/or incorporate various other communication ports that are not necessary labelled in FIG. 1.

Figure 2:
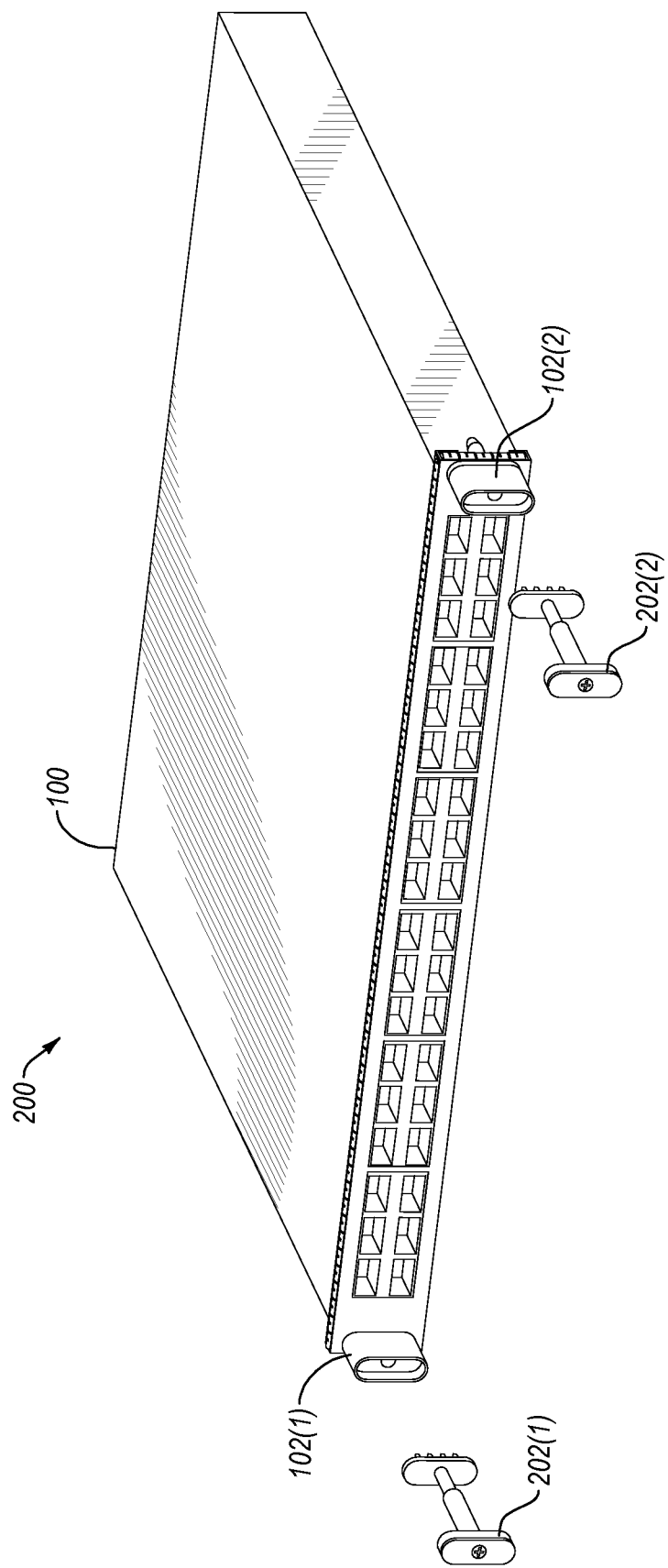
FIG. 2 is a block diagram of an exemplary implementation of an apparatus for modular cable management in telecommunications systems.

FIG. 2 shows an exemplary implementation 200 of an apparatus for modular cable management in telecommunications systems. As shown in FIG. 2, implementation 200 may include and/or involve one or more physical extension handles 202(1)-(2) (sometimes also referred to as physical cable guides or simply cable guides) that connect to and/or interface with one or more of ejectors 102(1)-(2) of line card 100. Physical extension handles 202(1)-(2) generally represent any type or form of physical member that extends from the ejectors of a line card such that an administrator is able to access the ejectors by way of the physical extension handles. Accordingly, the administrator may be able to secure the line card to and/or eject the line card from a chassis of a telecommunications system using physical extension handles 202(1)-(2) instead of using the ejectors directly. Examples of physical extension handles 202(1)-(2) include, without limitation, members, handles, levers, shafts, arms, cable guides, screws, grips, knobs, buttons, switches, variations of one or more of the same, combinations of one or more of the same, or any other suitable physical extension handles.

In some contexts, physical extension handles 202(1)-(2) may individually or collectively represent and/or constitute an apparatus for modular cable management in telecommunications systems. Accordingly, physical extension handles 202(1)-(2) may help improve modular cable management in telecommunications systems.

For example, physical extension handles 202(1)-(2) may serve as modular and/or removable cable guides that support communication cables connected to the line card in a horizontal orientation. In doing so, physical extension handles 202(1)-(2) may enable the communication cables to avoid hanging down vertically directly from the chassis of the telecommunications system. As a result, the communication cables may remain more organized and avoid forming a so-called "rat's nest". In other words, when connected to the chassis of the telecommunications system, physical extension handles 202(1)-(2) may guide the communication cables horizontally from the chassis of the telecommunications system such that the communication cables avoid hanging down vertically directly from the chassis in contact with additional communication cables connected to additional line cards secured to the chassis.

Accordingly, physical extension handles 202(1)-(2) may help improve the front-back airflow through the telecommunications system and thus decrease its operating temperature even in the event that the telecommunications system is heavily populated with line cards. Moreover, since physical extension handles 202(1)-(N) represent a modular cable management solution, physical extension handles 202(1)-(N) may be successfully installed to ejectors 102(1)-(2) even while the chassis of the telecommunications system is secured to a rack.

Figure 3:
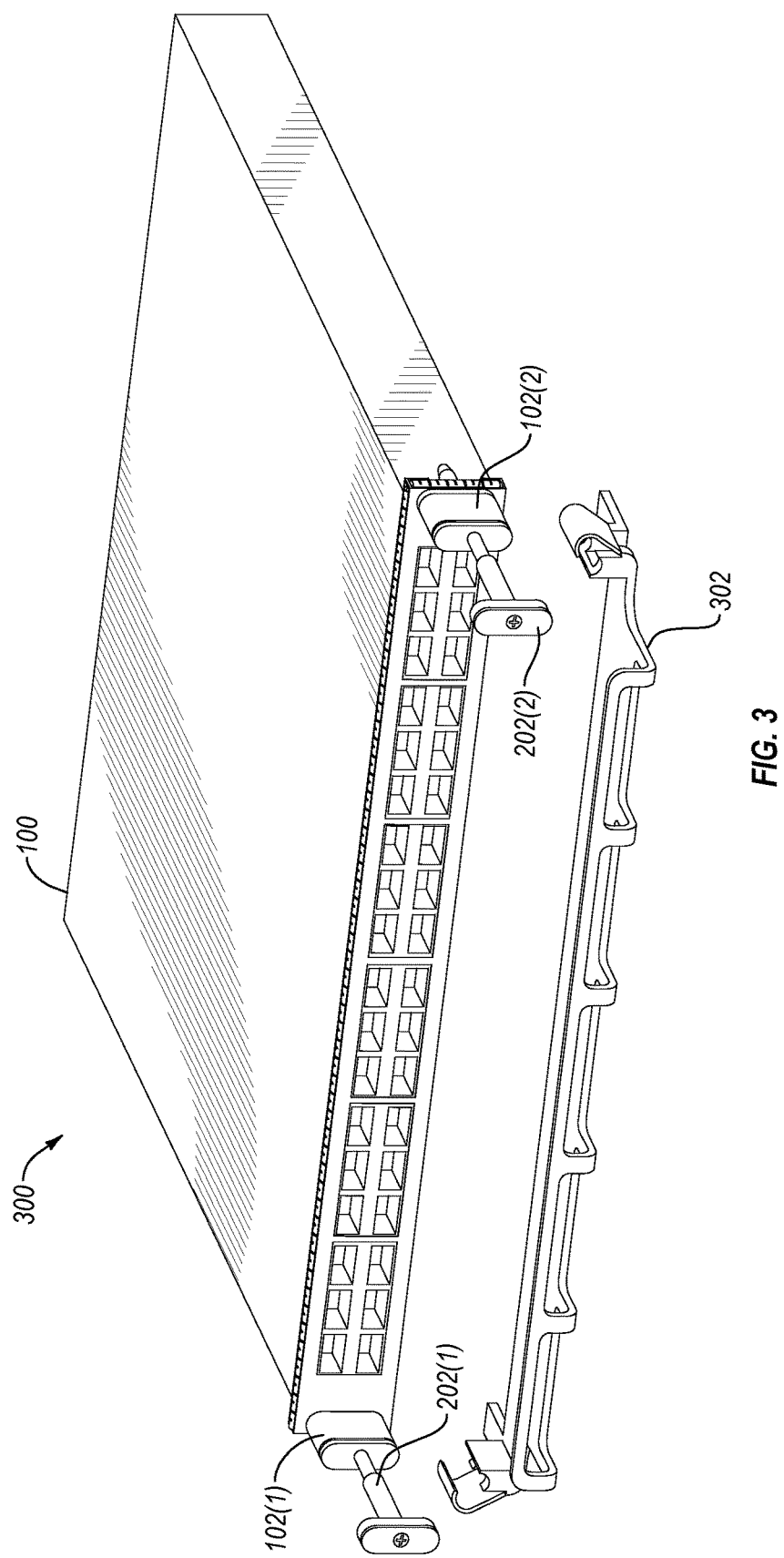
FIG. 3 is a block diagram of an exemplary implementation of an apparatus for modular cable management in telecommunications systems.

FIG. 3 shows an exemplary implementation 300 of an apparatus for modular cable management in telecommunications systems. As shown in FIG. 3, implementation 300 may include and/or involve one or more physical extension handles 202(1)-(2) connected to and/or interfacing with one or more of ejectors 102(1)-(2) of line card 100. In addition, implementation 300 may include and/or involve a cable tray 302 that connects to physical extension handles 202(1)-(2) and is capable of providing supplemental support for the communication cables connected to the line card to maintain those cables in the horizontal orientation. Cable tray 302 generally represents any type or form of physical member that bridges the gap between physical extension handles to support communication cables connected to a line card.

In one example, cable tray 302 may include a set of hooks designed to snap onto physical extension handles 202(1)-(2). In this example, one of the hooks may be located on one end of cable tray 302, and another one of the hooks may be located at the opposite end of cable tray 302. Cable tray 302 may be connected to physical extension handles 202(1)-(2) by snapping the hooks onto the respective physical extension handles.

Figure 4:
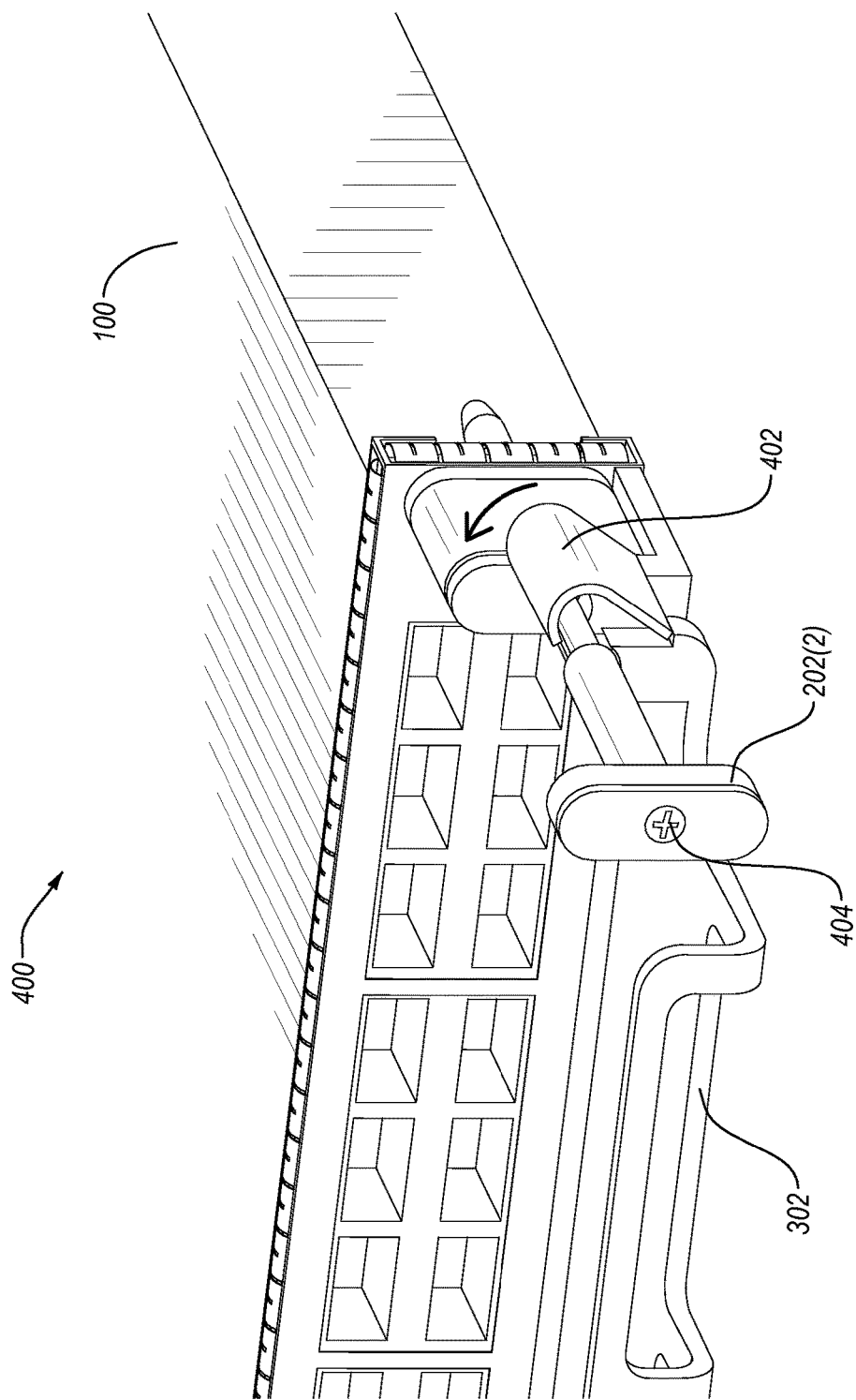
FIG. 4 is a block diagram of an exemplary implementation of an apparatus for modular cable management in telecommunications systems.

FIG. 4 shows one side of an exemplary implementation 400 of an apparatus for modular cable management in telecommunications systems. As shown in FIG. 4, implementation 400 may include and/or involve physical extension handle 202(2) connected to and/or interfacing with ejector 102(2) of line card 100 by way of a screw 404 that interfaces with a threaded hole in ejector 102(2). By interfacing with the threaded hole in this way, screw 404 may secure physical extension handle 202(2) to ejector 102(2).

In addition, implementation 400 may include and/or involve cable tray 302, which connects to physical extension handle 202(2) by snapping onto physical extension handle 202(2) with a hook 402. By snapping hook 402 of cable tray 302 onto physical extension handle 202(2) in this way, cable tray 302 may be secured to physical extension handle 202(2). Upon being secured to physical extension handle 202(2), cable tray 302 may be able to support the weight and/or direction of communication cables that are connected to the line card. In doing so, cable tray 302 may direct and/or guide the orientation of the communication cables such that they avoid hanging down vertically directly from the chassis of the telecommunications system.

Figure 5:
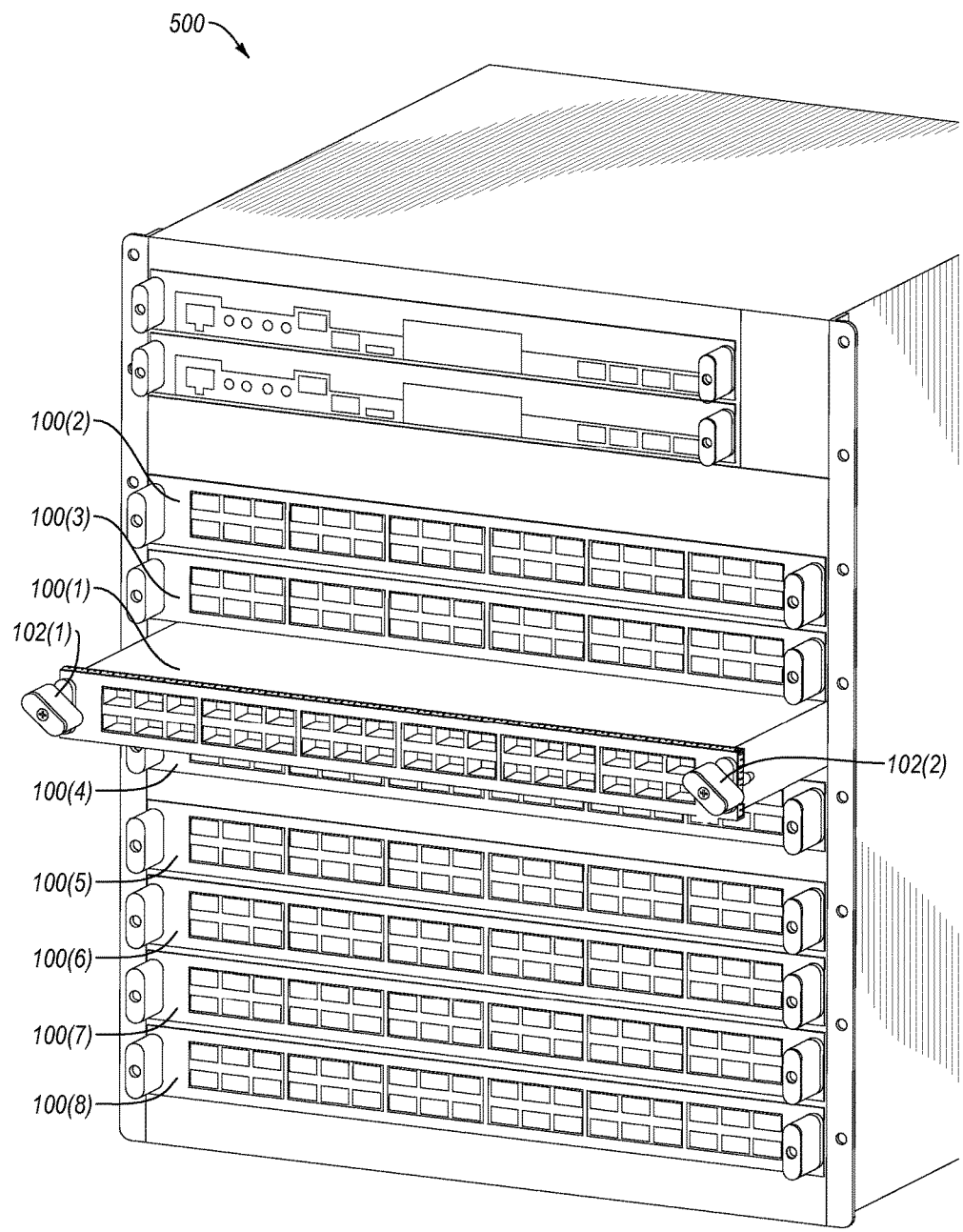
FIG. 5 is a block diagram of a line card being secured to a chassis of a telecommunications system.

FIG. 5 shows a block diagram of an exemplary line card 100(1) being secured to the chassis of a telecommunications system 500. In this example, telecommunications system 500 may include and/or house line cards 100(1), 100(2), 100(3), 100(4), 100(5), 100(6), 100(7), and 100(8). Telecommunications system 500 generally represents any type or form of computing system and/or device that facilitates data transfer and/or communication among computing devices and/or networks. Examples of telecommunications system 500 include, without limitation, routers, switches, bridges, network hubs, gateways, nodes, servers, racks or chassis housing one or more of the same, variations of one or more of the same, combinations of one or more of the same, or any other suitable telecommunications system.

In one example, an administrator of telecommunications system 500 may secure line card 100(1) to the chassis of telecommunications system 500 by rotating each of ejectors 102(1)-(2) in a clockwise direction into corresponding holes of the chassis. Additionally or alternatively, the administrator may eject line card 100(1) from the chassis of telecommunications system 500 by rotating each of ejectors 102(1)-(2) in a counterclockwise direction away from the corresponding holes of the chassis. In this example, line cards 100(2)-(8) may be secured to the chassis of telecommunications system 500 by their respective ejectors.

Figure 6:
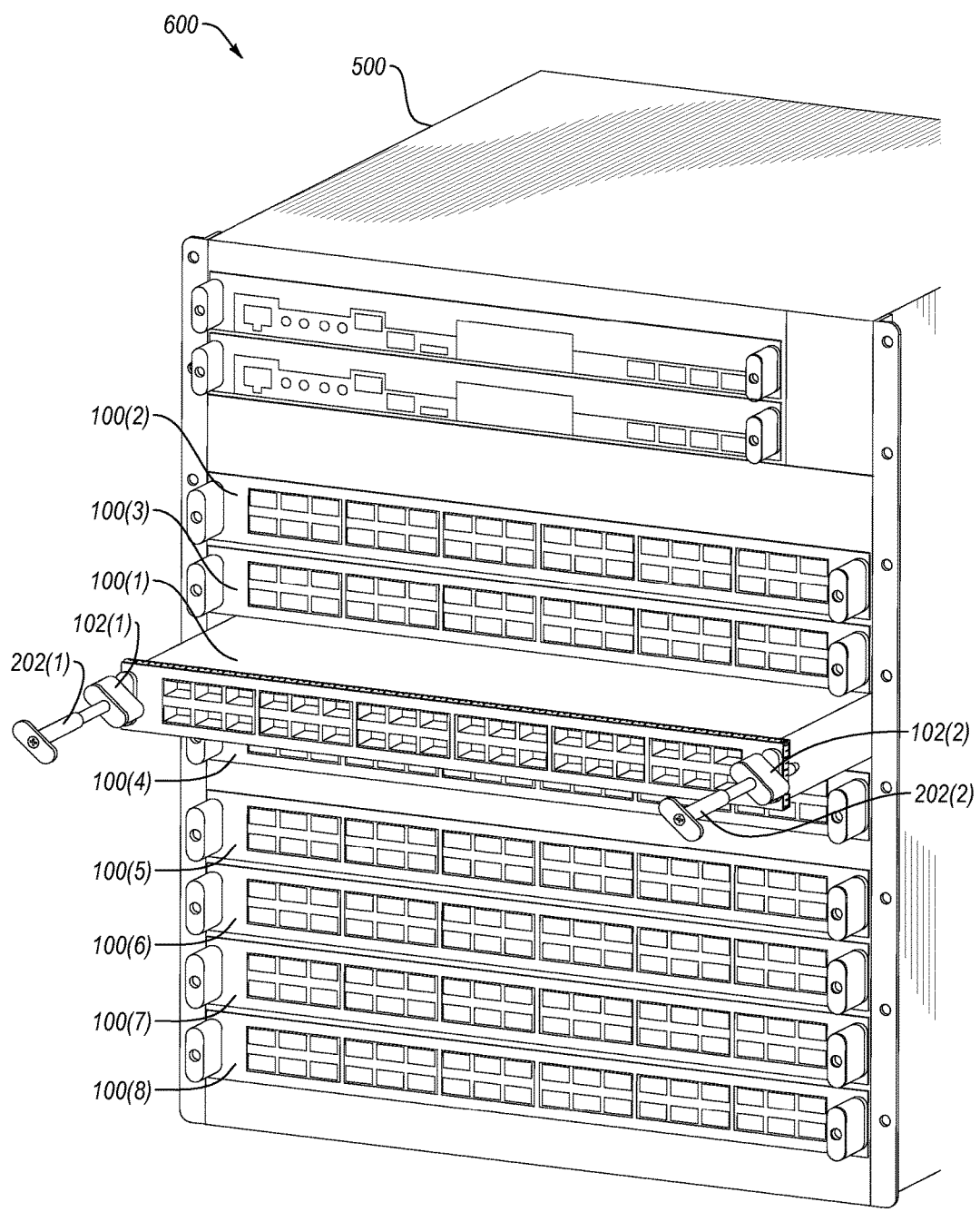
FIG. 6 is a block diagram of an exemplary implementation of an apparatus for modular cable management in telecommunications systems.

FIG. 6 shows an exemplary implementation 600 of an apparatus for modular cable management in telecommunications systems. As shown in FIG. 6, implementation 600 may include and/or involve line cards 100(1)-(8) and physical extension handles 202(1)-(2) that connect to and/or interface with ejectors 102(1)-(2) of line card 100(1). In one example, an administrator of telecommunications system 500 may be able to secure line card 100(1) to and/or eject line card 100(1) from the chassis of telecommunications system 500 using physical extension handles 202(1)-(2) instead of using ejectors 102(1)-(2) directly.

In one example, an administrator of telecommunications system 500 may secure line card 100(1) to the chassis of telecommunications system 500 by rotating each of physical extension handles 202(1)-(2) in a clockwise direction instead of rotating ejectors 102(1)-(2) directly. Additionally or alternatively, the administrator may eject line card 100(1) from the chassis of telecommunications system 500 by rotating each of physical extension handles 202(1)-(2) in a counterclockwise direction instead of rotating ejectors 102(1)-(2) directly.

Figure 7:
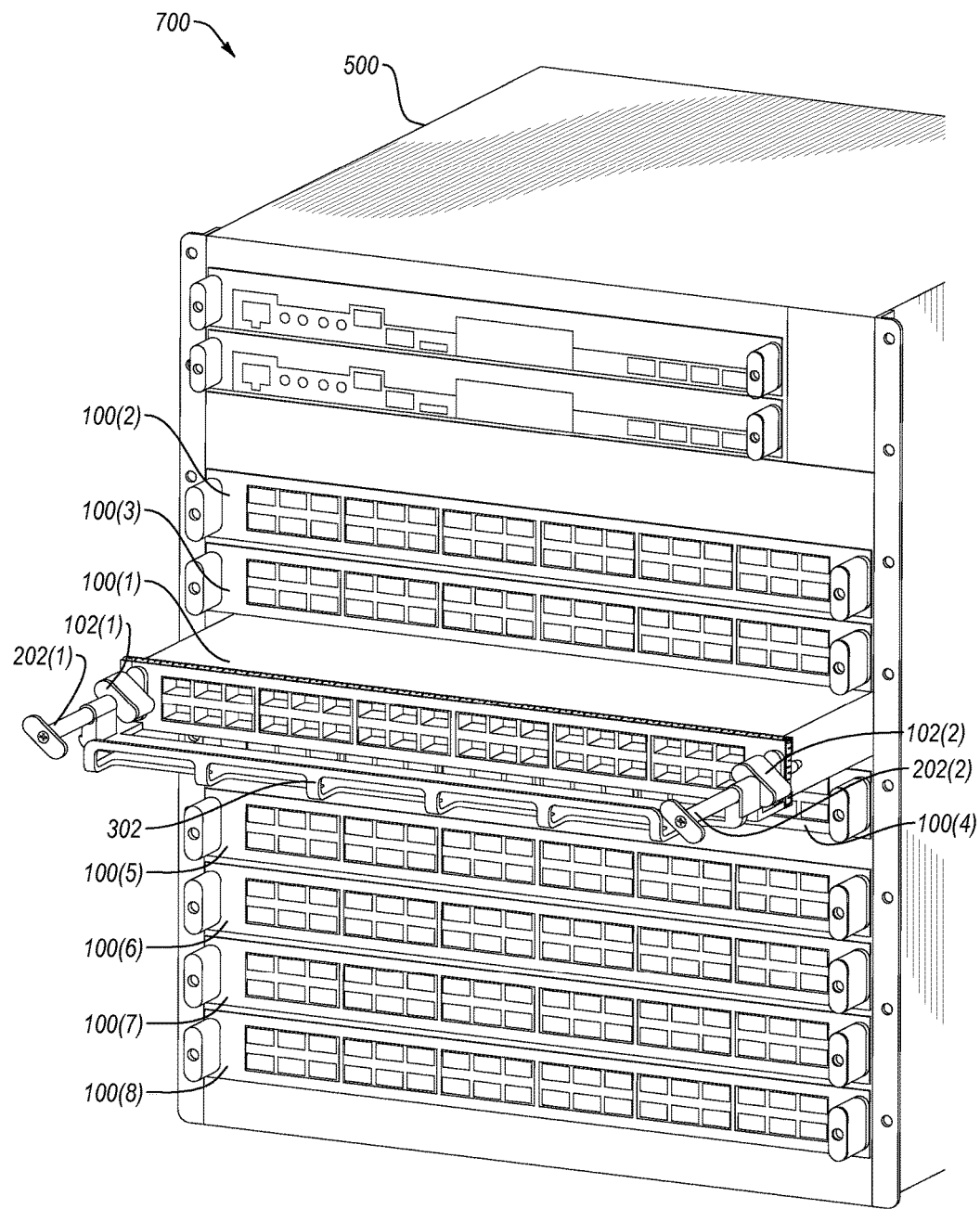
FIG. 7 is a block diagram of an exemplary implementation of an apparatus for modular cable management in telecommunications systems.

FIG. 7 shows an exemplary implementation 700 of an apparatus for modular cable management in telecommunications systems. As shown in FIG. 7, implementation 700 may include and/or involve line cards 100(1)-(8) and physical extension handles 202(1)-(2) that connect to and/or interface with ejectors 102(1)-(2) of line card 100(1). In addition, implementation 700 may include and/or involve cable tray 302 that connects to physical extension handles 202(1)-(2) and is capable of providing supplemental support for the communication cables connected to line card 100(1) to maintain those cables in a horizontal orientation. In one example, an administrator of telecommunications system 500 may be able to secure line card 100(1) to and/or eject line card 100(1) from the chassis of telecommunications system 500 while cable tray 302 is connected to physical extension handles 202(1)-(2). Additionally or alternatively, the administrator may connect cable tray 302 to physical extension handles 202(1)-(2) after line card 100(1) has been secured to the chassis of telecommunications system 500.

Figure 8:
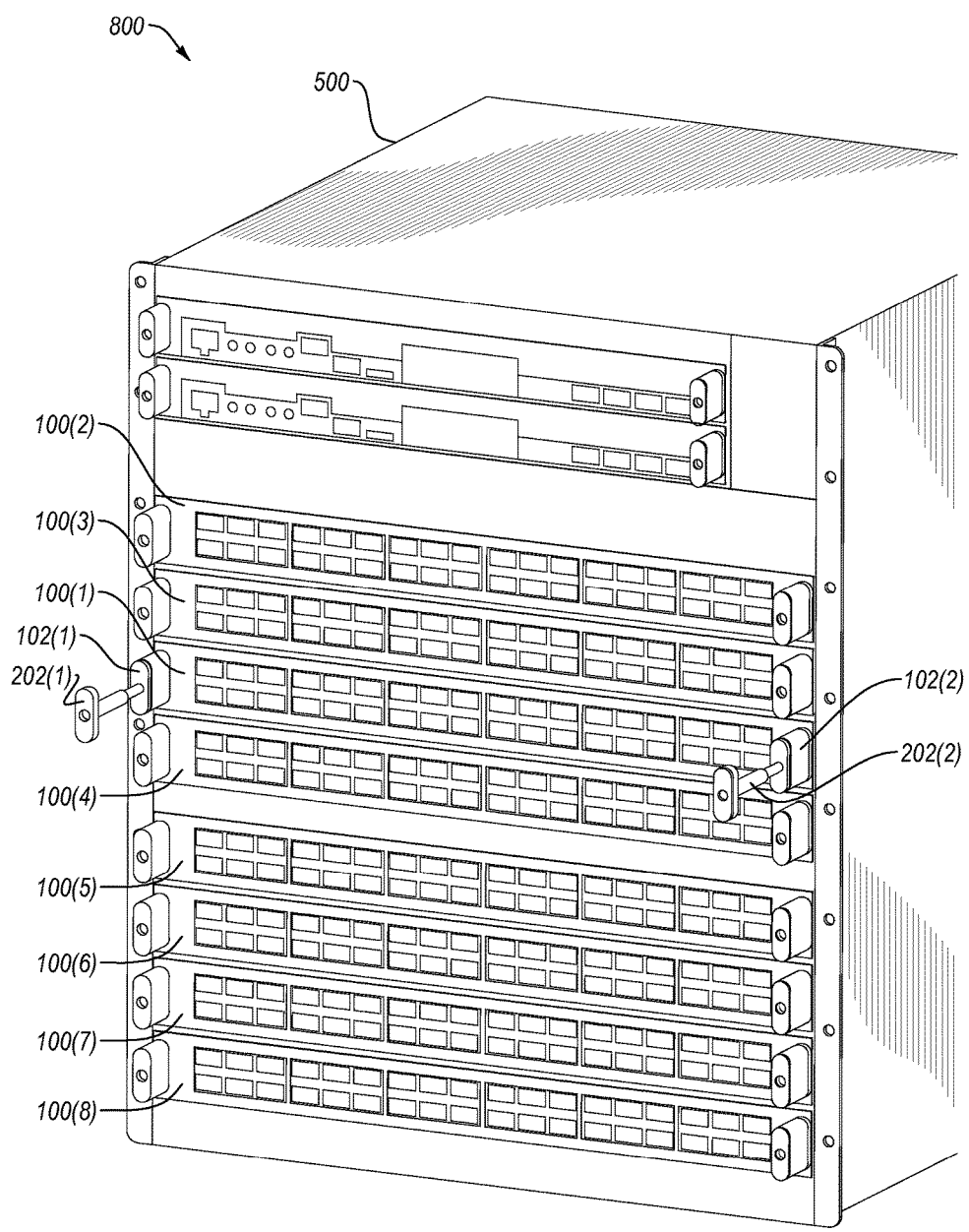
FIG. 8 is a block diagram of an exemplary implementation of an apparatus for modular cable management in telecommunications systems.

FIG. 8 shows an exemplary implementation 800 of an apparatus for modular cable management in telecommunications systems. As shown in FIG. 8, implementation 800 may include and/or involve line cards 100(1)-(8) and physical extension handles 202(1)-(2) that connect to and/or interface with ejectors 102(1)-(2) of line card 100(1). In this example, line card 100(1) may be secured to the chassis of telecommunications system 500 due at least in part to an administrator having rotated physical extension handles 202(1)-(2) clockwise until reaching a forced stop.

Figure 9:
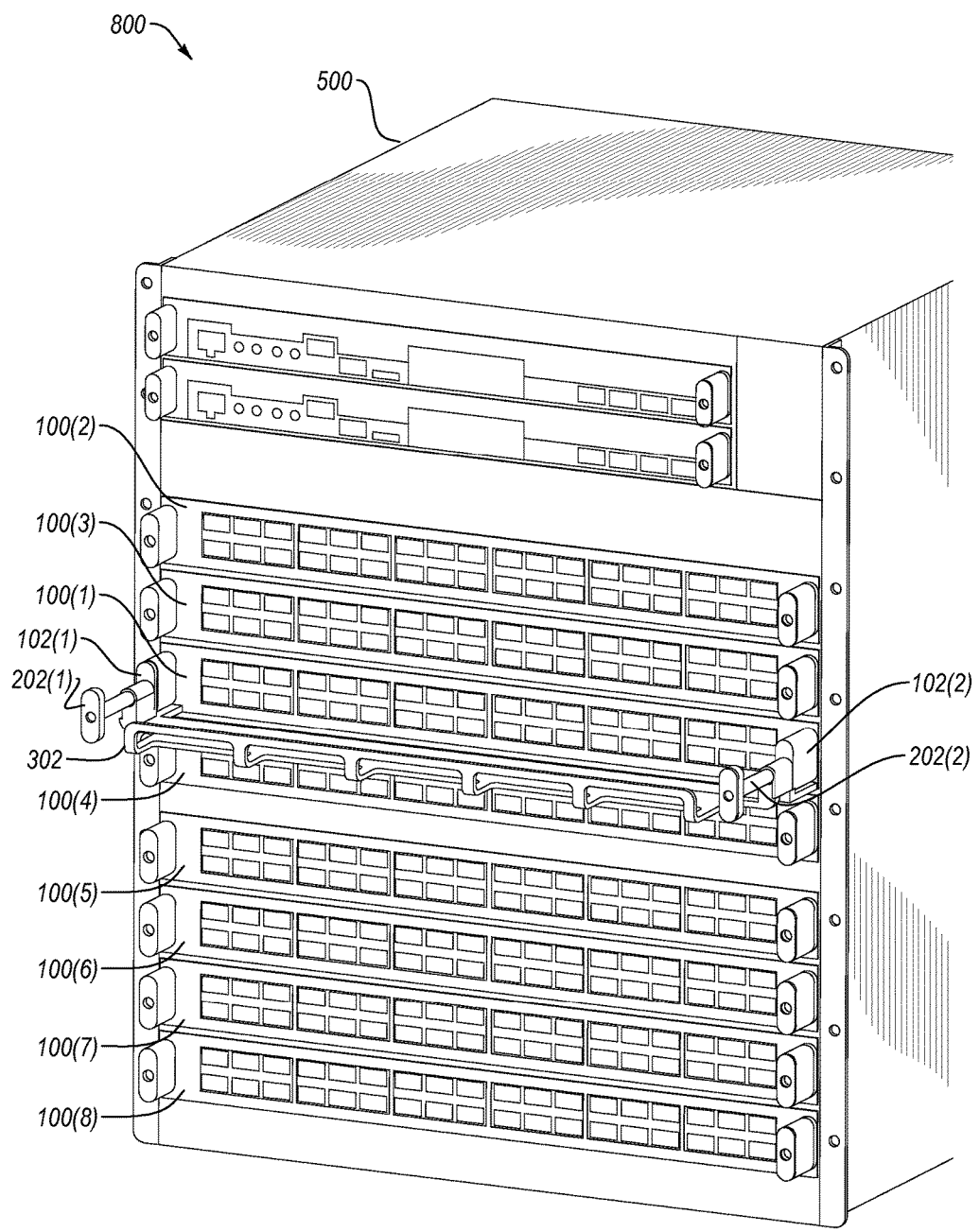
FIG. 9 is a block diagram of an exemplary implementation of an apparatus for modular cable management in telecommunications systems.

FIG. 9 shows an exemplary implementation 900 of an apparatus for modular cable management in telecommunications systems. As shown in FIG. 9, implementation 900 may include and/or involve line cards 100(1)-(8) and physical extension handles 202(1)-(2) that connect to and/or interface with ejectors 102(1)-(2) of line card 100(1). In addition, implementation 900 may include and/or involve cable tray 302 that connects to physical extension handles 202(1)-(2) and is capable of providing supplemental support for the communication cables connected to line card 100(1) to maintain those cables in a horizontal orientation.

In this example, line card 100(1) may be secured to the chassis of telecommunications system 500 due at least in part to an administrator having rotated physical extension handles 202(1)-(2) clockwise until reaching a forced stop. Cable tray 302 may already be connected while the administrator is rotating physical extension hands 202(1)-(2) to secure line card 100(1) to the chassis of telecommunications system 500. Alternatively, the administrator may connect cable tray 302 to physical extension handles 202(1)-(2) after line card 100(1) has been secured to the chassis of telecommunications system 500.

Figure 10:
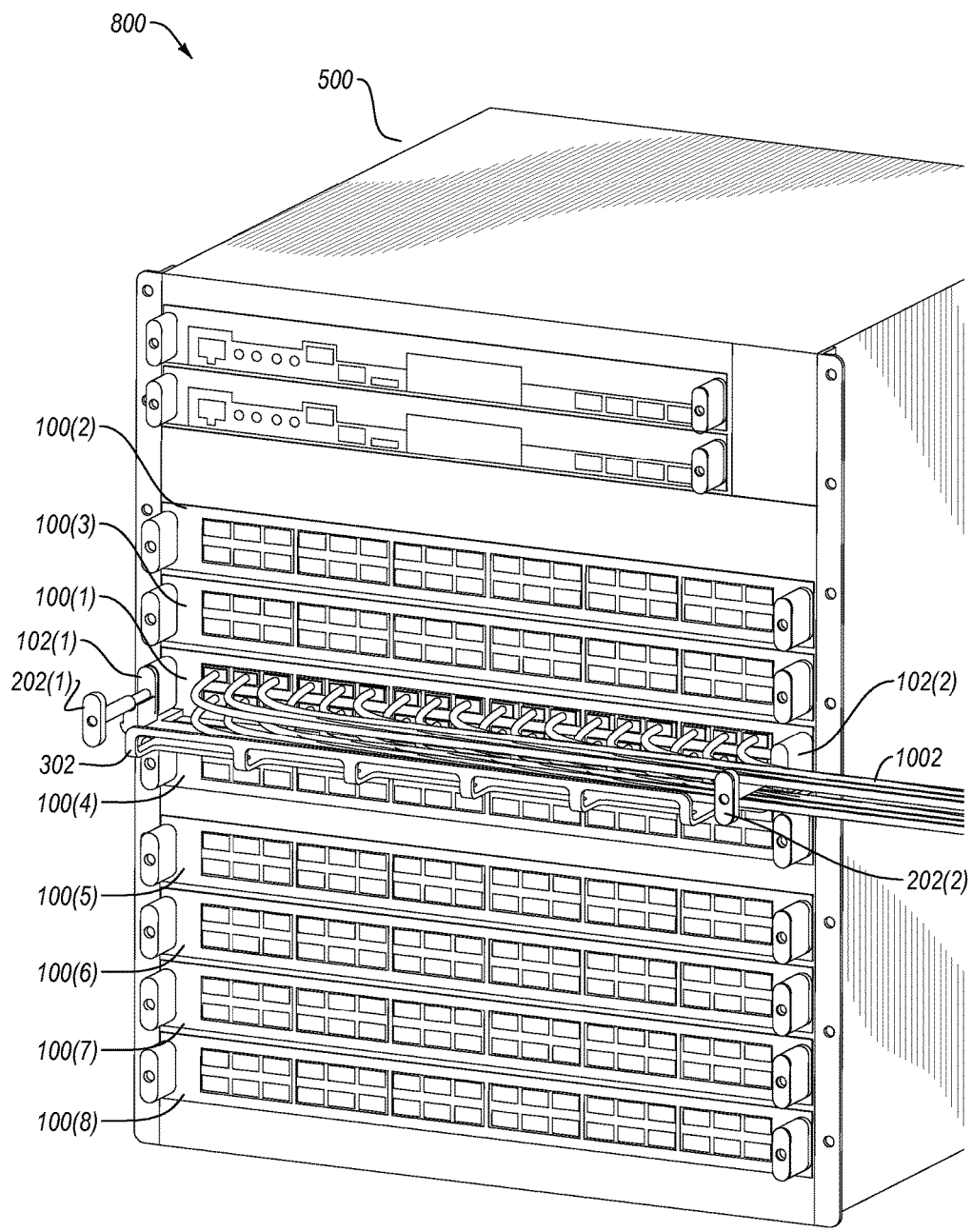
FIG. 10 is a block diagram of an exemplary implementation of an apparatus for modular cable management in telecommunications systems.

FIG. 10 shows an exemplary implementation 1000 of an apparatus for modular cable management in telecommunications systems. As shown in FIG. 10, implementation 1000 may include and/or involve line cards 100(1)-(8) and physical extension handles 202(1)-(2) that connect to and/or interface with ejectors 102(1)-(2) of line card 100(1). In addition, implementation 1000 may include and/or involve cable tray 302 that connects to physical extension handles 202(1)-(2) and provides supplemental support to communication cables 1002 connected to line card 100(1) to maintain communication cables 1002 in a horizontal orientation.

Examples of communication cables 1002 include, without limitation, QSFP cables, Ethernet cables, fiber optic cables, Fibre Channel cables, optical cables, InfiniBand cables, CXP cables, MPO cables, XAUI cables, XFP cables, XFI cables, CFP cables, variations of one or more of the same, combinations of one or more of the same, or any other suitable communication cables. Although FIG. 10 illustrates all of communication cables 1002 running in one horizontal direction (e.g., to the right), communication cables 1002 may alternatively run in both horizontal directions (e.g., to both the left and the right) or the opposite direction (e.g., to the left).

Figure 11:
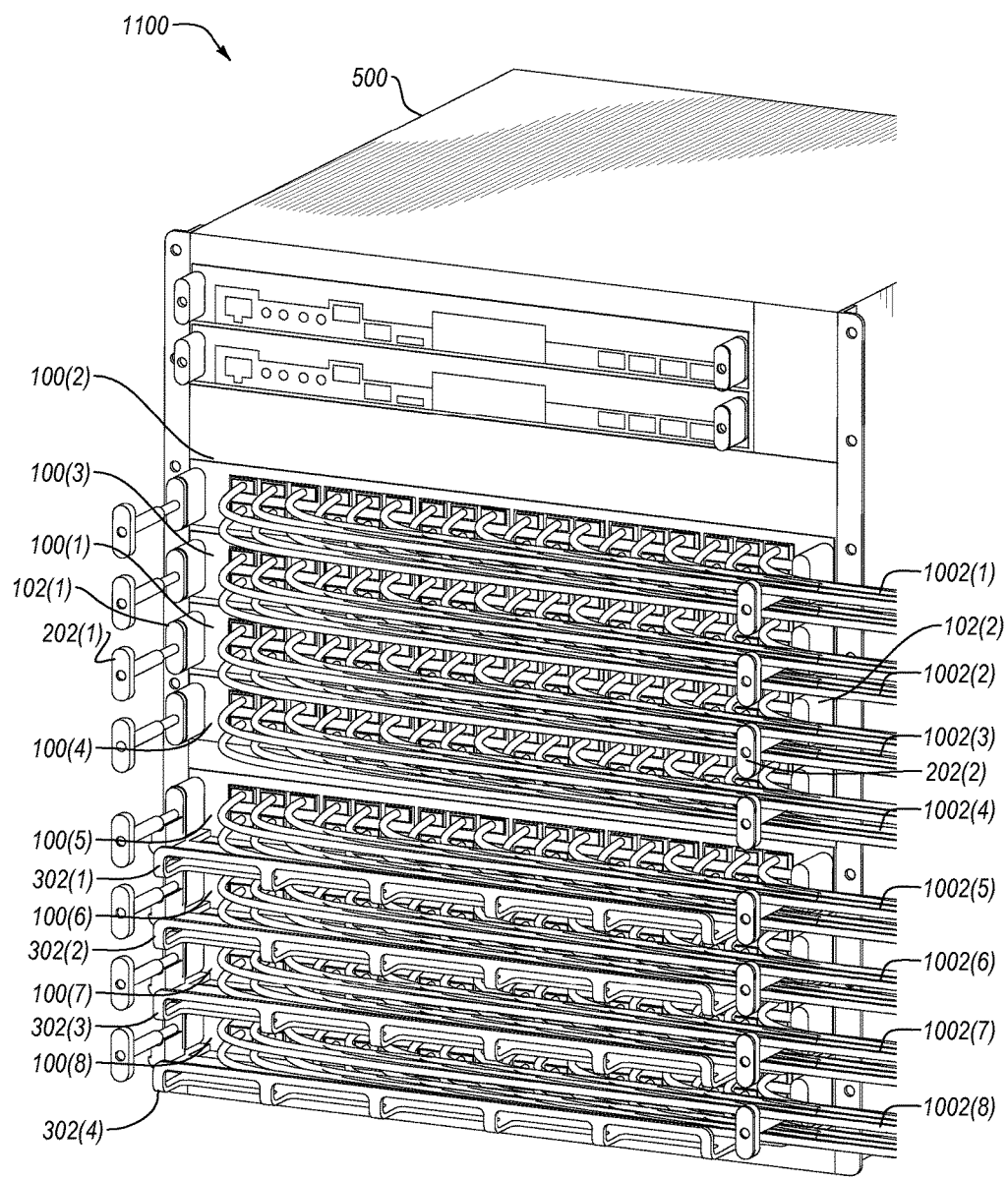
FIG. 11 is a block diagram of an exemplary implementation of an apparatus for modular cable management in telecommunications systems.

FIG. 11 shows an exemplary implementation 1000 of an apparatus for modular cable management in telecommunications systems. As shown in FIG. 11, implementation 1100 may include and/or involve line cards 100(1)-(8) and physical extension handles that connect to and/or interface with the ejectors of each of line cards 100(1)-(8). In addition, implementation 1100 may include and/or involve communication cables 1002(1), 1002(2), 1002(3), 1002(4), 1002(5), 1002(6), 1002(7), and 1002(8) connected to line cards 100(2), 100(3), 100(1), 100(4), 100(5), 100(6), 100(7), and 100(8), respectively. Implementation 1100 may also include cable trays 302(1), 302(2), 302(3), and 302(4) that connect to the physical extension handles of line cards 100(5)-(8), respectively.

In this example, cable trays 302(1)-(4) may provide supplemental support to communication cables 1002(5)-(8) connected to line cards 100(5)-(8) to maintain communication cables 1002(5)-(8) in a horizontal orientation. Although FIG. 11 illustrates all of communication cables 1002(1)-(8) running in one horizontal direction (e.g., to the right), some of communication cables 1002(1)-(8) may alternatively run in both horizontal directions (e.g., to both the left and the right) or the opposite direction (e.g., to the left).

Figure 12:
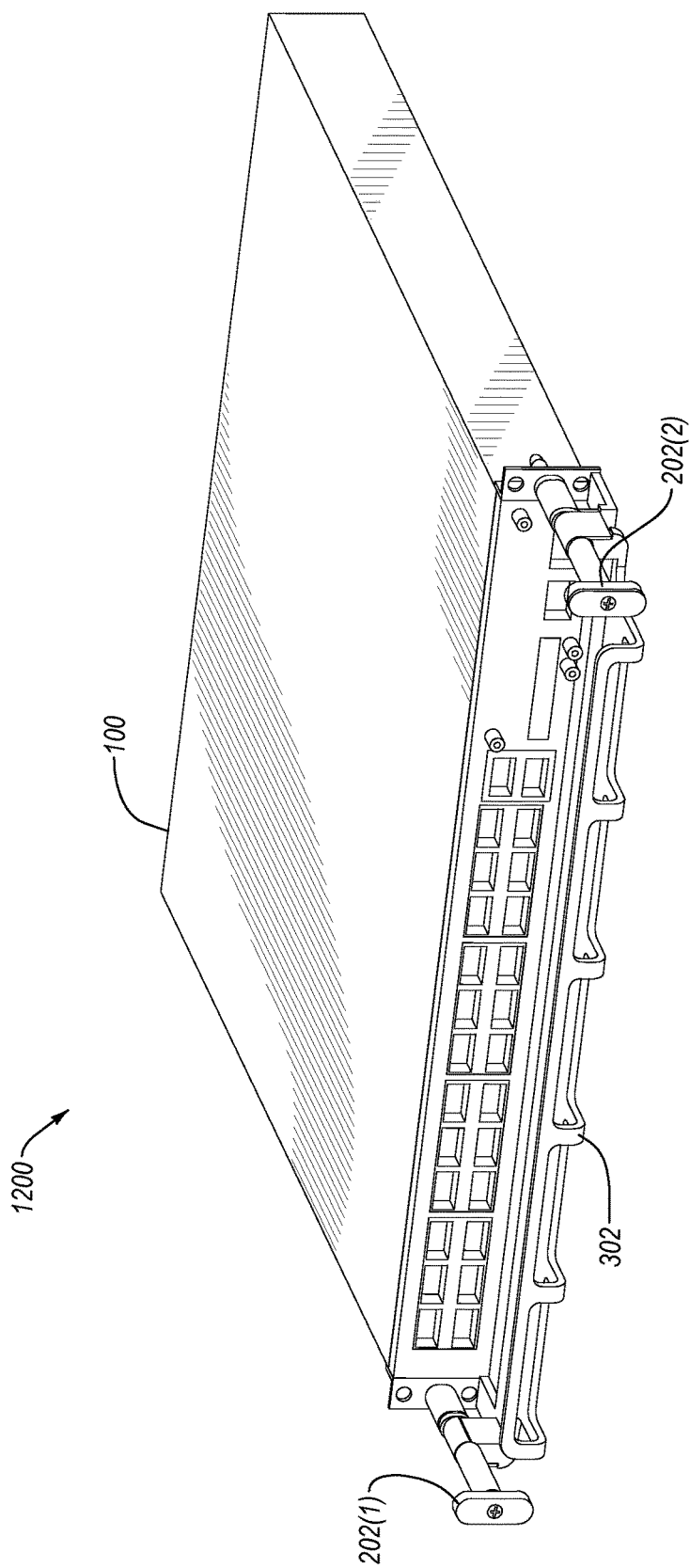
FIG. 12 is a block diagram of an exemplary implementation of an apparatus for modular cable management in telecommunications systems.

FIG. 12 shows an exemplary implementation 1200 of an apparatus for modular cable management in telecommunications systems. As shown in FIG. 12, implementation 1200 may include and/or involve one or more physical extension handles 202(1)-(2) that connect to and/or interface with the side rails of line card 100 and/or secure line card 100 to a chassis of a telecommunications system. In this example, physical extension handles 202(1)-(2) may not connect to and/or interface with any ejectors since this configuration of line card 100 does not have any ejectors.

As shown in FIG. 12, physical extension handle 202(1) may extend from one end of line card 100 and facilitate physically supporting one or more communication cables connected to line card 100 in a horizontal orientation. Similarly, physical extension handle 202(2) may extend from another end of line card 100 and facilitate physically supporting one or more communication cables connected to line card 100 in a horizontal orientation.

In addition, implementation 1200 may include and/or involve cable tray 302 that connects to and/or interfaces with physical extension handles 202(1)-(2). Cable tray 302 may provide supplemental support for the communication cable to maintain the communication cables in the horizontal orientation.

While the foregoing disclosure sets forth various embodiments using specific illustrations, flowcharts, and examples, each illustration component, flowchart step, operation, and/or component described and/or exemplified herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An apparatus comprising:
at least one physical extension handle that is installed to at least one helical ejector that:
rotates in one direction into at least one threaded hole of a chassis of a telecommunications system to secure a line card to the chassis of the telecommunications system; and
rotates in another direction away from the threaded hole of the chassis of the telecommunications system to eject the line card from the chassis of the telecommunications system; and
wherein the physical extension handle, when installed to the helical ejector:
extends the helical ejector such that a user is able to access the helical ejector by way of the physical extension handle to secure the line card to or eject the line card from the chassis of the telecommunications system using the physical extension handle; and
facilitates physically supporting one or more communication cables connected to the line card in a horizontal orientation such that the communication cables avoid hanging down vertically directly from the chassis.

2. The apparatus of claim 1, wherein the physical extension handle, when installed to the helical ejector, guides the communication cables horizontally from the chassis such that the communication cables avoid hanging down vertically directly from the chassis in contact with one or more additional communication cables connected to one or more additional line cards secured to the chassis.

3. The apparatus of claim 1, wherein the physical extension handle that is installed to the helical ejector is positioned on an end of the line card; and
further comprising:
another physical extension handle that is installed to another helical ejector that is positioned on an opposite end of the line card; and
a cable tray that:
connects to the physical extension handle and the other physical extension handle; and
provides supplemental support for the communication cables to maintain the communication cables in the horizontal orientation.

4. The apparatus of claim 3, wherein:
the cable tray includes:
a hook located on an end of the cable tray; and
another hook located on another end of the cable tray; and
the cable tray is connected to the physical extension handle and the other physical extension handle by snapping the hook onto the physical extension handle and the other hook onto the other physical extension handle.

5. The apparatus of claim 3, wherein each of the physical extension handle, the other physical extension handle, and the cable tray are individually modular or removable relative to the line card.

6. The apparatus of claim 3, wherein:
a portion of the communication cables connected to the line card extend horizontally in a direction toward the end of the line card and are supported by the physical extension handle; and
another portion of the communication cables connected to the line card extend horizontally in an opposite direction toward the opposite end of the line card and are supported by the other physical extension handle.

7. The apparatus of claim 1, wherein the physical extension handle is installed to the helical ejector by way of a screw that:
interfaces with a threaded hole in the helical ejector; and
secures the physical extension handle to the helical ejector.

8. The apparatus of claim 1, wherein the helical ejector includes a helical member that is screwed into a threaded hole in the chassis to secure the line card to the chassis.

9. A line card comprising:
at least one helical ejector that facilitates:
securing the line card to a chassis of a telecommunications system by rotating in one direction into at least one threaded hole of the chassis of the telecommunications system; and
ejecting the line card from the chassis of the telecommunications system by rotating in another direction away from the threaded hole of the chassis of the telecommunications system; and
at least one physical extension handle that:
is installed to the helical ejector to extend the helical ejector such that a user is able to access the helical ejector by way of the physical extension handle to secure the line card to or eject the line card from the chassis of the telecommunications system using the physical extension handle; and
facilitates physically supporting one or more communication cables connected to the line card in a horizontal orientation such that the communication cables avoid hanging down vertically directly from the chassis.

10. The line card of claim 9, wherein the physical extension handle guides the communication cables horizontally from the chassis such that the communication cables avoid hanging down vertically in contact with one or more additional communication cables connected to one or more additional line cards secured to the chassis.

11. The line card of claim 9, wherein the physical extension handle that is installed to the helical ejector is positioned on an end of the line card; and
further comprising:
another physical extension handle that is installed to another helical ejector that is positioned on an opposite end of the line card; and
a cable tray that:
connects to the physical extension handle and the other physical extension handle; and
provides supplemental support for the communication cables to maintain the communication cables in the horizontal orientation.

12. The line card of claim 11, wherein:
the cable tray includes:
   a hook located on an end of the cable tray; and
   another hook located on another end of the cable tray; and
the cable tray is connected to the physical extension handle and the other physical extension handle by snapping the hook onto the physical extension handle and the other hook onto the other physical extension handle.

13. The line card of claim 11, wherein each of the physical extension handle, the other physical extension handle, and the cable tray are individually modular or removable relative to the line card.

14. The line card of claim 11, wherein:
a portion of the communication cables connected to the line card extend horizontally in a direction toward the end of the line card and are supported by the physical extension handle; and
another portion of the communication cables connected to the line card extend horizontally in an opposite direction toward the opposite end of the line card and are supported by the other physical extension handle.

15. The line card of claim 9, wherein the physical extension handle is installed to the helical ejector by way of a screw that:
   interfaces with a threaded hole in the helical ejector; and
   secures the physical extension handle to the helical ejector.

16. The line card of claim 9, wherein the helical ejector includes a helical member that is screwed into a threaded hole in the chassis to secure the line card to the chassis.

* * * * *